(12) United States Patent
Hurwitz (10) Patent No.: US 9,269,593 B2
(45) Date of Patent: Feb. 23, 2016

(54) MULTILAYER ELECTRONIC STRUCTURE WITH INTEGRAL STEPPED STACKED STRUCTURES

(75) Inventor: Dror Hurwitz, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 940 days.

(21) Appl. No.: 13/482,099

(22) Filed: May 29, 2012

(65) Prior Publication Data

US 2013/0319737 A1  Dec. 5, 2013

(51) Int. Cl.

| | |
|---|---|
| H05K 1/09 | (2006.01) |
| H05K 3/46 | (2006.01) |
| H05K 1/00 | (2006.01) |
| H05K 1/11 | (2006.01) |
| H05K 1/02 | (2006.01) |
| H01L 21/48 | (2006.01) |
| H01L 23/367 | (2006.01) |
| H01L 23/498 | (2006.01) |

(52) U.S. Cl.
CPC ........ *H01L 21/4846* (2013.01); *H01L 23/3677* (2013.01); *H01L 23/49827* (2013.01); *H01L 2224/16* (2013.01)

(58) Field of Classification Search
CPC ..... H05K 1/115; H05K 1/116; H05K 3/4038; H05K 3/42; H05K 3/421; H05K 2201/09509; H05K 2201/09518; H05K 2201/096; H05K 2201/09609

USPC ................................................. 174/260–267
See application file for complete search history.

(56) References Cited

U.S. PATENT DOCUMENTS

| | | | | |
|---|---|---|---|---|
| 5,227,013 | A * | 7/1993 | Kumar | 216/18 |
| 5,432,675 | A * | 7/1995 | Sorimachi et al. | 361/719 |
| 7,211,510 | B2 * | 5/2007 | Meadows | 438/667 |
| 7,635,641 | B2 | 12/2009 | Hurwitz et al. | |
| 7,669,320 | B2 | 3/2010 | Hurwitz et al. | |
| 7,682,972 | B2 | 3/2010 | Hurwitz et al. | |
| 8,158,892 | B2 * | 4/2012 | Goergen et al. | 174/266 |
| 2007/0289127 | A1 * | 12/2007 | Hurwitz et al. | 29/827 |
| 2008/0121422 | A1 | 5/2008 | Karasawa et al. | |
| 2009/0001509 | A1 * | 1/2009 | Lin | 257/531 |
| 2010/0319979 | A1 * | 12/2010 | Hsu | 174/262 |
| 2011/0260329 | A1 | 10/2011 | Seo | |
| 2012/0049343 | A1 * | 3/2012 | Schulze et al. | 257/737 |
| 2012/0181698 | A1 * | 7/2012 | Xie et al. | 257/770 |

* cited by examiner

*Primary Examiner* — Hoa C Nguyen
*Assistant Examiner* — Amol Patel
(74) *Attorney, Agent, or Firm* — Wiggin and Dana LLP; Gregory S. Rosenblatt; Jonathan D. Hall (57) ABSTRACT

A multilayer electronic support structure comprising a plurality of layers extending in an X-Y plane consisting of a dielectric material surrounding metal via posts that conduct in a Z direction perpendicular to the X-Y plane, wherein a stacked via structure crossing at least two via layers of the plurality of layers comprises at least two via posts in neighboring via layers wherein the at least two stacked via posts in neighboring layers have different dimensions in the X-Y plane, such that the stacked via structure tapers.

29 Claims, 4 Drawing Sheets

Fig. 1

Prior Art

MULTILAYER ELECTRONIC STRUCTURE WITH INTEGRAL STEPPED STACKED STRUCTURES

BACKGROUND

1. Field of the Disclosure

The present invention is directed to improved interconnect structures, and specifically but not exclusively to integral stepped via stacks and methods for their fabrication.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

Although the range of acceptable sizes and reliability is improving over time, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

The size of laser drilled vias in composite dielectric materials are practically limited to a minimum of about $60 \times 10^{-6}$ m diameter, and even so suffer from significant tapering with depth, as well as rough side walls due to the nature of the composite material drilled, in consequence of the ablation process involved.

In addition to the other limitations of laser drilling as described hereinabove, there is a further limitation of the drill & fill technology in that it is difficult to fabricate different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias. Consequently, in practice, all drill & fill vias in a single layer have a nominally the same diameter, albeit affected by ablation and tapering.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is laid over the seed layer and subsequently developed to create a pattern which is selectively removed to make trenches that expose the seed layer. Via posts are created by depositing Copper into the photo-resist trenches. The remaining photo-resist is then removed, the seed layer is etched away, and a dielectric material that is typically a polymer impregnated glass fiber pre-preg, is laminated thereover and therearound to encase the vias posts. Various techniques and processes can then be used to remove part of the dielectric material, thereby planarizing and thinning the structure and exposing the tops of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on top of this and a pattern is developed therein, and the pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts.

The via layers created by pattern plating or panel plating methodologies described above are typically known as 'via posts' and feature layers from copper.

It will be appreciated that the general thrust of the microelectronic evolution is directed towards fabricating ever smaller, thinner and lighter and more powerful products having high reliability. The use of thick, cored interconnects, prevents ultra-thin products being attainable. To create ever higher densities of structures in the interconnect IC substrate or 'interposer', ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. It includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second half stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

An aspect of the invention is directed to providing a multilayer electronic support structure comprising a plurality of layers extending in an X-Y plane consisting of a dielectric material surrounding metal via posts that conduct in a Z direction perpendicular to the X-Y plane, wherein a stacked via structure crossing at least two via layers of the plurality of layers comprises at least two via posts in neighboring via layers wherein the at least two stacked via posts in neighboring layers have different dimensions in the X-Y plane, such that the stacked via structure tapers.

In some embodiments, the stacked via structure comprises at least three via posts.

In some embodiments, each layer of the stacked via structure is rectangular and each subsequent layer extends in one direction less than each previous layer and the stacked via structure has a stepped profile in one direction.

In some embodiments, each layer of the stacked via structure is rectangular and each subsequent via extends in two opposite directions less than each previous via and the stacked via structure has a generally trapezoidal shape.

In some embodiments, each layer of the stacked via structure is rectangular and each subsequent via extends in three opposite directions less than each previous via and the stacked via structure has a generally pyramidal shape with three stepped diagonal side faces and one substantially smooth side face perpendicular to a top and bottom surface of the multilayer composite electronic structure.

In some embodiments, each layer of the stacked via structure is rectangular and each subsequent via extends in four opposite directions less than each previous layer and the stack has a generally stepped pyramid shape.

In some embodiments, each layer of the stacked via structure is circular and each subsequent via extends less than each previous via and the stacked via structure has a generally stepped conical shape.

In some embodiments, the multilayer electronic support structure comprises at least 4 vias.

In some embodiments, the multilayer electronic support structure comprises at least 5 vias.

In some embodiments, at least one metal layer comprises a metal seed layer.

In some embodiments, the seed layer further comprises an adhesive metal layer first laid down to promote adhesion to the dielectric material.

In some embodiments, the adhesive metal layer comprises at least one of the group comprising titanium, chromium, tantalum and tungsten.

In some embodiments, a bottom layer in the stacked via structure is at least 30% larger than a top layer.

In some embodiments, a stacked via structure crossing at least two layers of the plurality of layers comprises at least two neighboring via posts, wherein the at least two neighboring via posts have different dimensions in the X-Y plane, and a seed layer interposed between the two neighboring via posts extends further in the X-Y plane than at least one of the two neighboring via posts.

In some embodiments, the seed layer extends further in the X-Y plane than the two neighboring via posts.

In some embodiments, at least one of the seed layer and the metal of the stack of vias comprises copper.

In some embodiments, the dielectric material comprises a polymer.

In some embodiments, the dielectric material further comprises ceramic or glass inclusions.

In some embodiments, previous layers of the stack extend further in the X-Y plane than subsequent layers and the stacked via post structure has a generally pyramidal shape.

In some embodiments, previous layers of the stack extend less in the X-Y plane than the extent of subsequent layers and the stack has a generally inverse pyramidal shape.

In some embodiments, the multilayer electronic support structure comprises more than three layers; at least one inner layer extends further than adjacent outer layers on at least one side, and the stack has an outwardly bowing profile on said at least one side.

In some embodiments, the multilayer electronic support structure comprises more than three layers, wherein at least one inner layer extends less than adjacent outer layers on at least one side, and the stack has an inwardly bowing profile on said at least one side.

A second aspect of the invention is directed to a process of fabricating the multilayer electronic support structure comprising the steps of:
(a) obtaining a substrate including an underlying via layer that is treated to expose ends of vias in the underlying via layer;
(b) covering the substrate with a seed layer;
(c) applying a layer of photo-resist over the seed layer;
(d) exposing and developing the photo-resist to form a negative pattern of features;
(e) depositing metal into the negative pattern to fabricate a layer of features;
(f) stripping away the photo-resist, leaving the layer of features upstanding;
(g) applying a second layer of photoresist over the seed layer and the layer of features;
(h) exposing and developing a pattern of vias in the second layer of photoresist;
(i) electroplating copper into the second pattern, and
(j) stripping away the second layer of photoresist:
(k) removing the seed layer, and
(l) laminating a dielectric material over the at least one component in the via layer.

In some embodiments, the process comprises the further step (m) of thinning the dielectric material to expose the metal of the at least one component.

In some embodiments, the process comprises the further step (n) of depositing a metal seed layer over the thinned dielectric material with the exposed metal component.

In some embodiments, the multilayer electronic support structure is further characterized by at least one of:
(i) the seed layer comprising copper;
(ii) the metal layer comprising copper;
(iii) the dielectric material comprises a polymer, and
(iv) the dielectric material comprises ceramic or glass reinforcements.

In some embodiments, the multilayer electronic support structure is further characterized by at least one of:
(i) the dielectric layer comprising a polymer selected from the group comprising polyimide, epoxy, Bismaleimide, Triazine and blends thereof;
(ii) the dielectric layer comprising glass fibers, and
(iv) the dielectric layer comprisings particle fillers.

In some embodiments, at least one via layer is fabricated by a process comprising the steps of:
(i) obtaining a substrate including a feature layer and having exposed copper;
(ii) covering the feature layer with a seed layer;
(iii) depositing a metal layer over the seed layer;
(iv) applying a layer of photo-resist over the metal layer;
(v) exposing and developing a positive pattern of vias in the photoresist;
(vi) etching away the metal layer exposed;
(vii) stripping away the photo-resist, leave the at least one component in the via layer upstanding, and
(viii) laminating a dielectric material over the at least one component in the via layer.

Optionally, the process comprises the further step (ix) of thinning the dielectric material to expose the metal.

Optionally, the process comprises the further step (x) of depositing a metal seed layer over the ground surface.

The term microns or µm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. No. 7,682,972, U.S. Pat. No. 7,669,320 and U.S. Pat. No. 7,635,641 to Hurwitz et al., incorporated herein by reference, that there is no effective upper limit to the in-plane dimensions of a feature.

Figure 1:
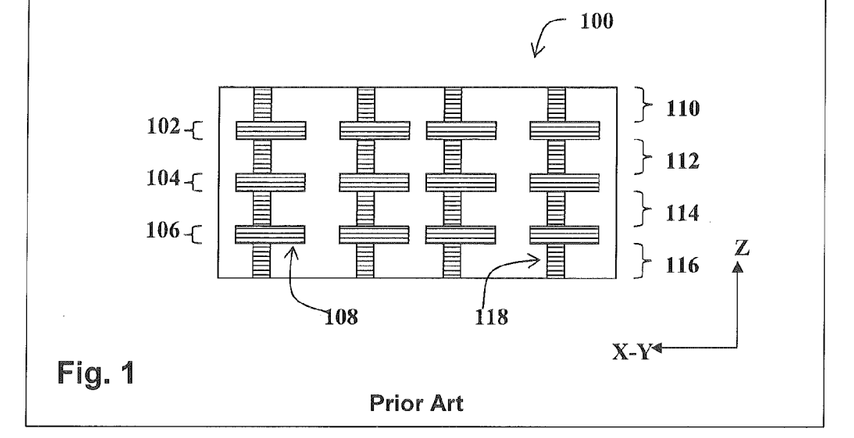
FIG. 1 is a simplified section through a multilayer composite support structure of the prior art.

FIG. 1 is a simplified section through a multilayer composite support structure of the prior art. Multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section, as they are fabricated by first drilling a laser hole in the dielectric. Since the dielectric is heterogeneous and anisotropic, and consists of a polymer matrix with inorganic fillers and glass fiber reinforcements, the circular cross-section thereof is typically rough edged and the cross-sections thereof may be slightly distorted from a true circular shape. Furthermore, the vias tend to taper somewhat, being inverse frusto-conical instead of cylindrical.

As described in U.S. Pat. No. 7,682,972, U.S. Pat. No. 7,669,320 and U.S. Pat. No. 7,635,641, for example, the structure of FIG. 1 may alternatively be fabricated by plating in a pattern in a photo-resist (pattern plating), or panel plating and then selectively etching, either way leaving up standing via posts, and then laminating a dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

Furthermore, it will be noted that laser drilled vias in composite dielectric materials such as polyimide/glass or epoxy/glass or BT (Bismaleimide/Triazine)/glass or their blends with ceramic and/or other filler particles, are practically limited to a minimal size of about $60 \times 10^{-6}$ m diameter, and even so suffer from significant tapering shape as well as rough side walls due to the nature of the composite material drilled, in consequence of the ablation process involved.

It has been surprisingly found that using the flexibility of the plating and photo-resist techniques, a wide range of via shapes and sizes may be cost-effectively fabricated. Furthermore, different via shapes and sizes may be fabricated in the same layer. The proprietary via post approach developed by AMITEC, enables 'conductor via' structures that utilize the large dimensions of the via layer to conduct in the x-y plane. This is especially facilitated when the copper pattern plating approach is used, where smooth, straight, non-tapering trenches may be produced in a photo-resist material, and then filled by subsequently depositing copper into these trenches by using a metal seed layer and then filling by pattern plating copper into the trenches. In contrast to the drilled & filled via approach, via post technology enables trenches in a photoresist layer to be filled to obtain dimple-less, dome-less copper connectors. After deposition of the copper the photoresist is subsequent stripped away, the metal seed layer is subsequently removed and a permanent, polymer-glass dielectric is applied thereover and therearound. The 'via conductor' structure thus created may use the process flows as described in U.S. Pat. No. 7,682,972, U.S. Pat. No. 7,669,320 and U.S. Pat. No. 7,635,641 to Hurwitz et al.

Figure 2:
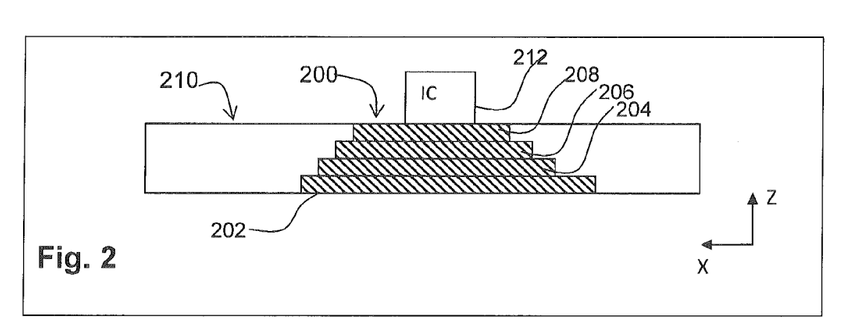
FIG. 2 is a schematic illustration of a cross-section through a trapezoidal stack of vias in accordance with one embodiment of the present invention.

With reference to FIG. 2, a section through a tapered stack of via posts 200 is shown. The stack 200 consists of a first layer 202, a second layer 204, a third layer 206 and fourth layer 208 surrounded by a dielectric material 210.

Since each layer is deposited on a previous layer that is larger, it is possible to fabricate each layer by pattern plating into subsequently deposited layers of photo-resist without intermediary copper conductors or pads in the X-Y planes.

In one example, the bottom layer 202 of the stack 200 may be $320 \times 10^{-6}$ m by $840 \times 10^{-6}$ m (i.e. microns or μm). The second layer 204 may be $320 \times 10^{6}$ m by $840 \times 10^{-6}$ m, the third layer 206 may be $220 \times 10^{-6}$ m by $740 \times 10^{-6}$ m, and the fourth (top) layer 208 may be $120 \times 10^{-6}$ m×640 by $10^{-6}$ m. Thus each layer may be 40 to 50 microns wider in all dimensions, than the layer thereabove.

In FIG. 2, a trapezoidal stepped via stack including 4 layers is shown. The trapezoidal stepped via stack tapers or slopes symmetrically in two directions. However, it will be appreciated that with careful alignment, the stepped via stack may be configured not to slope symmetrically, or to slope in one direction only.

Figure 3:
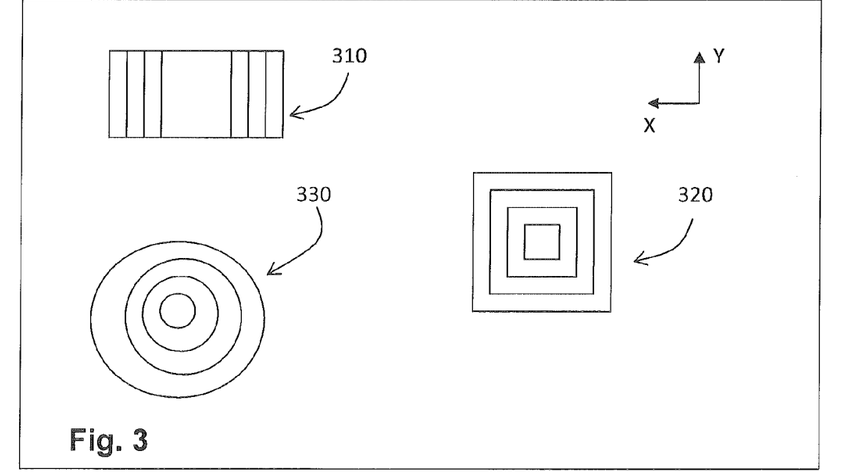
FIG. 3 shows trapezoidal, pyramidal and conical vias from above.

With reference to FIG. 3, from above, the stepped stack of vias 310 may be rectangular and may slope in two directions. Alternatively, the stack 320 may be square and may slope in 4 directions. Although not shown, it will be appreciated, that by laying each subsequent layer asymmetrically, the stacks sloping in one or three dimensions may be fabricated.

Furthermore, a stack 330 may comprise disk shaped layers and be conical. Depending on the diameter of each disk and alignment, the stack may be regular or irregular.

A stacked via structure crosses at least two layers of the plurality of layers in the interconnect structure and consists of at least two overlapping via posts in adjacent layers having different dimensions in the X-Y plane, such that the stack tapers. More typically, the via stack comprises at least three layers and may consist of 4 or 5 layers or more.

In some embodiments, each layer of the stack is rectangular and each subsequent layer extends in one direction less than each previous layer and the stack comprises a stepped structure in one direction. In other embodiments, each layer of the stack is rectangular and each subsequent layer extends in two opposite directions less than each previous layer and the stack has a generally trapezoidal shape.

In yet other embodiments, each layer of the stack is square or rectangular, and each subsequent layer extends in three opposite directions less than each previous layer and the stack has a generally pyramidal shape with three stepped diagonal side faces and one substantially smooth side face perpendicular to a top and bottom layer.

In yet other embodiments, each layer of the stack is rectangular and each subsequent layer extends in four opposite directions less than each previous layer and the stack has a generally stepped pyramid shape.

In some embodiments, each layer of the stack is circular and each subsequent layer extends less than each previous layer and the stack has a generally stepped conical shape.

In general, as shown in FIG. 1, interconnect structures typically comprise alternating via layers and feature layers. Using Amitec's proprietary technology, the via layers may also extend in the X-Y plane and need not be simple cylindrical posts but may have other shapes.

Although an upright pyramid comprises layers of metal laid down over more extensive layers, in surrounding areas of an interconnect structure, it may be necessary to lay down features onto dielectric. Thus to enable fabrication of a tapering via stack in an interconnect structure, the via layers may be interspersed with features layers or pads. These will typically consist of a seed layer which may be copper, and may be fabricated by sputtering or by electroless plating to adhere to underlying dielectric. The seed layer may be 0.5 to 1.5 microns thick. Over the seed layer, a relatively thick layer or pad of metal, typically copper, may be pattern or panel plated. To further aid adherence of the seed layer to the underlying dielectric, a very thin layer, typically 0.04 microns to 0.1 microns of an adhesion metal, such as titanium, tantalum, tungsten, chromium or mixtures thereof, may first be applied.

In some embodiments, a bottom layer in the stack is at least 30% larger than a top layer.

Figure 4:
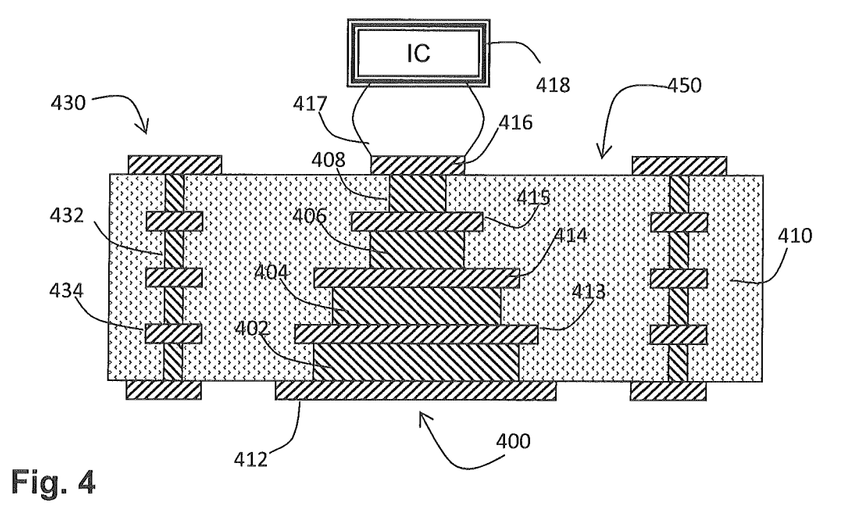
FIG. 4 is a cross section through a trapezoidal stack of via and feature layers in accordance with a second embodiment.

With reference to FIG. 4, a section of an interconnect structure 450 including a stack 400 of copper via posts and feature layers having a stepped profile is shown. The stack 400 is surrounded by dielectric material 410. The stack 400 consists of four via layers of copper; a first via layer 402, a second via layer 404, a third via layer 406, and fourth via layer 408, surrounded by a dielectric material 410. The layers 402, 404, 406, 408 may be geometrically separated from each other but electronically coupled together by copper conductors or pads in the X-Y planes 413, 414 and 415. These pads 413, 414 and 415 are parts of feature layers that will typically include surrounding features in other parts of the interconnect structure, not shown. To enable the features to be laid down on top of dielectric, to create the noses of the steps shown, but more significantly, to create surrounding features, pads 413, 414 and 415 generally include a seed layer of copper that may be sputtered or electroless plated, and may be 0.5 microns to 1.5 microns thick. Onto the seed layer, additional thickness of the pad or feature may be built up using electroplating. To further aid adhesion to the dielectric, a very thin layer of an adhesion metal, such as titanium, tantalum, chromium, tungsten or mixtures thereof may be first deposited. The thin adhesion metal layer is typically 0.04 microns to 0.1 microns thick.

An IC chip 418 may be coupled to the stack 400 via a termination 417 such as a ball grid array, for example, to a top conductor layer 416. The stack 400, thus formed, may be a trapezoidal or a pyramidal via stack depending on its shape and whether it slopes in two or four directions. Where the individual layers are circular, the stack may be referred to as a conical via stack. The use of seed layers and alternating feature layers (pads) and vias, enables more traditional structures 430 of vias 432 and features 434 to be cofabricated elsewhere in the interconnect 450.

In some embodiments, a stacked via structure crossing at least two layers of the plurality of layers comprises at least two via posts in adjacent layers, wherein the at least two stacked via posts in adjacent layers have different dimensions in the X-Y plane, and a feature layer is interposed between the previous and the subsequent layer.

The feature layer may extends further in the X-Y plane than at least one of the previous and the subsequent layers, In some embodiments, the feature layer extends further in the X-Y plane than the extent of either the previous or the subsequent layer, providing the structure of FIG. 4, or, the subsequent via layer may be deposited exactly onto the feature layer, using the same masks, providing a structure such as that shown in FIG. 2.

In FIG. 4, the pads of the feature layer in the X-Y planes, 413, 414, 415 and 416 can be the same size or few microns larger than the via post there under. If the copper conductors or pads are the same size as the via post thereunder, the appearance of the stack will be similar to that shown in FIG. 2, however, the manufacturing technique enables surrounding feature layers and stacks to be fabricated. The copper pad in the top layer 416 may be appropriately sized to an IC (Integrated Circuit) 418 and coupled thereto by an interconnecting bump 417 representing flip chip, die bonding or other appropriate technology. The bottom pad layer 412 (attached to via post layer 402) may be attached to a Printed Circuit Board (PCB), for example.

By using such a trapezoidal or pyramidal stack 400 of via posts, the top pad layer 416 may be significantly smaller, perhaps about 28% of the area of the bottom pad layer 412. The via post area of the bottom layer 402 may be 3.5 times that of the via post top layer 408. One advantage in having such a large lower surface is to enable effective heat dissipation and so the bottom layer 402 can serve very effectively as a heat sink. However it is advantageous to have a small top surface of such a via stack at the same time, which may be dimensioned to the size of an IC 418, as this may assist in the interposing density function of the substrate by redistributing the IC high density small pad size represented by the copper pad of 416 to that of the PCB domain represented by the copper pad of 412 without significantly reducing the heat dissipation performance of the substrate.

It may also be advantageous in that by having a relatively small top surface structure, it is possible to utilize the surrounding surface more effectively. For example, components mounted on the surrounding surface may be larger.

It has thus been found that using AMITEC technology as described in U.S. Pat. No. 7,682,972, U.S. Pat. No. 7,669,320 and U.S. Pat. No. 7,635,641 to Hurwitz et al., incorporated herein by reference in their entirety, it is possible to create via post structures having variable cross-section profiles, such as trapezoidal, pyramidal, conical, and triangular prism shaped via posts that may slope in one or two directions.

It will be appreciated that where using seed and feature layers, not only may tapering via stacks be fabricated where each subsequently laid down layer is smaller than the previous. Due to the feature layer enabling a feature in one layer to protrude more than features in underlying layers, via stacks that are wider in the middle (convex) or narrower in the middle (concave) may be fabricated. The via stacks may bow in one direction with the opposite wall being flat, in two directions, or in three or four directions.

It will further be appreciated that by using this type of stacking and the via post approach, tapering (i.e. trapezoidal or pyramidal), concave and convex via structures may be produced in close proximity to more regular via post stacks, where the via posts in subsequent layers maintain their dimensions in the x-y plane to provide maximum utilization of the substrate where trapezoidal via stacks are not required.

In some embodiments, previous layers of the stack extend less in the X-Y plane than the extent of subsequent layers and the stack has a generally inverse pyramidal shape.

In some embodiments, the multilayer stack of vias in the multilayer electronic support structure comprises more than three layers; at least one inner layer extends further than adjacent outer layers on at least one side, and the stack has an outwardly bowing profile on said at least one side.

In some embodiments, the stack in the multilayer electronic structure comprises more than three layers, wherein at least one inner layer extends less than adjacent outer layers on at least one side, and the stack has an inwardly bowing profile on said at least one side.

Thus there is a large amount of flexibility inherent with the plate and etch and selective pattern plating technology developed by AMITEC and Access and generally described U.S. Pat. No. 7,682,972, U.S. Pat. No. 7,669,320 and U.S. Pat. No. 7,635,641 to Hurwitz et al., incorporated herein by reference.

Figure 5:
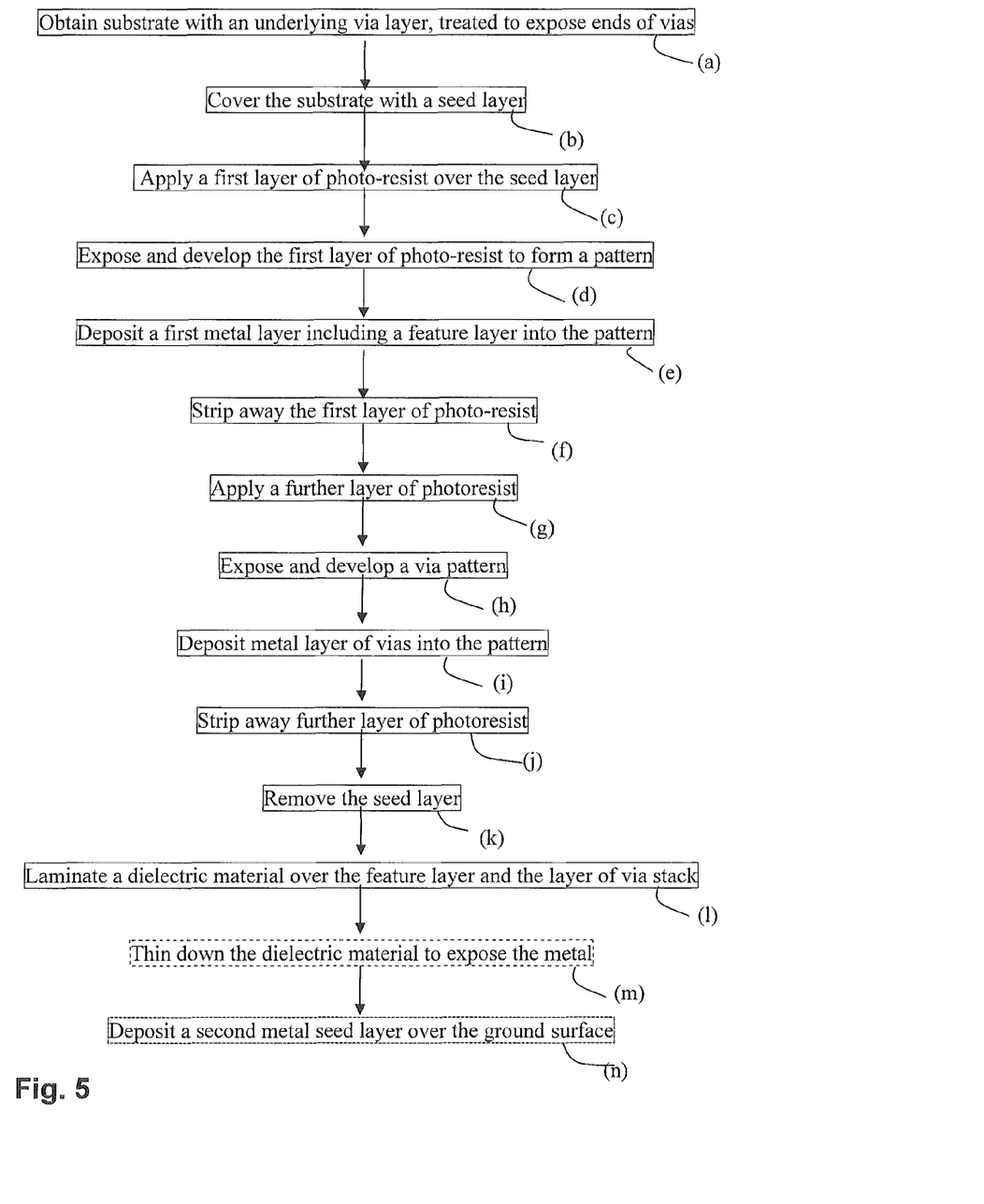
FIG. 5 is one flowchart showing one method for fabricating the structure of FIG. 4.

Referring to FIG. 5, in some embodiments, the contoured via stack of FIG. 4 may be fabricated by the steps of: obtaining a substrate including an underlying via layer that is treated to expose the copper thereof—step (a), and covering the substrate with a seed layer—step (b), typically copper and typically by sputtering or by electroless plating. Optionally, a very thin, perhaps 0.04 to 0.1 micron layer of an adhesion metal, such as tantalum, titanium, chromium or tungsten is first deposited before the copper is deposited thereover. A first layer of photoresist is then applied over the seed layer—step (c), and exposed and developed to form a negative pattern—step (d). A metal layer, typically copper, is electroplated into the negative pattern—step (e), and the photoresist is stripped away—step (f), leaving a first layer of pads upstanding. A second layer of photoresist may now be applied over the pads—step (g), and a pattern of a second via layer may be exposed and developed in the second layer of photoresist—step (h). A second via layer of metal may be deposited into the trenches of the second pattern, either by electroplating or electroless plating to create a via layer—step (i), and the second layer of photoresist may be stripped away—step (j), leaving a stack of two layers, a feature or pad layer followed by a via layer, one on top of the other.

The seed layer is then removed—step (k). Optionally, it is etched away with a wet etch of ammonium hydroxide or copper chloride, for example, and a dielectric material is laminated (l) over the upstanding copper of the pad and via layers.

To enable further build up of additional layers, the dielectric material may be thinned to expose the metal, by mechanical, chemical or mechanical-chemical grinding or polishing which also planarizes the top surface—step (m). Then a metal seed layer, such as copper, may be deposited over the ground surface—step (n), to enable further layers to be built up, by repeating steps (c) to (n).

The dielectric material is generally a composite material comprising a polymer matrix, such as polyimide, epoxy, Bis-maleimide, Triazine and blends thereof, and may further glass fibers and ceramic particle fillers, and is generally applied as a pre-preg consisting of woven glass fibers in a polymer resin.

Figure 6:
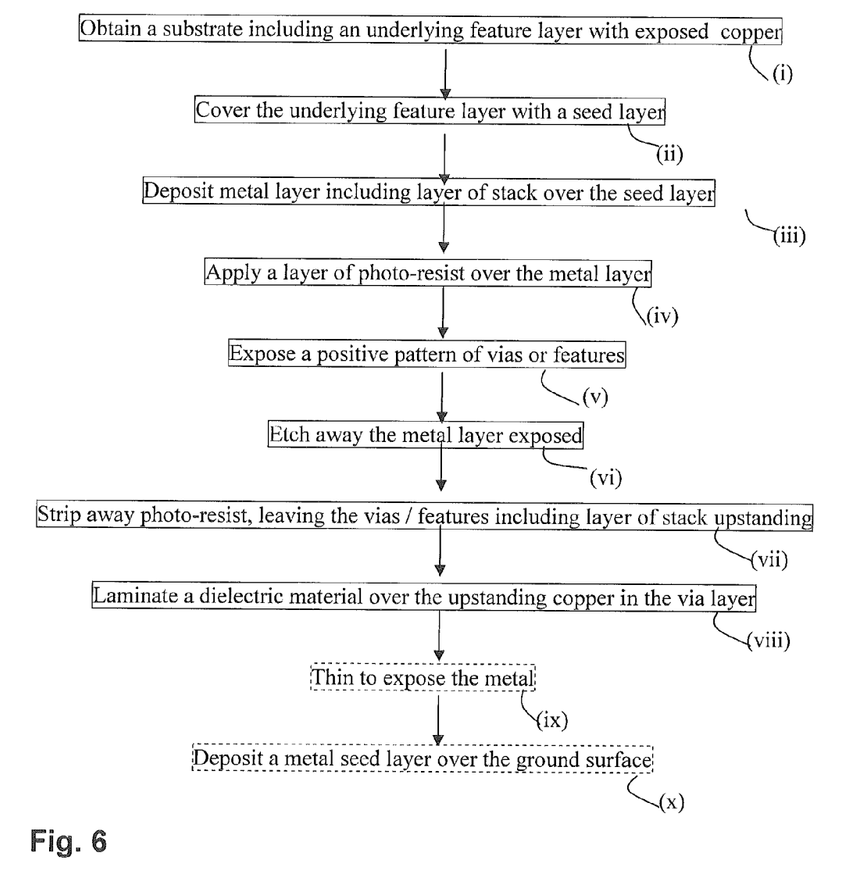
FIG. 6 is a second flowchart showing another method for fabricating layers of the structure of FIG. 2 or 4.

Referring to FIG. 6, in a variant fabrication route, the at least one via layer may be fabricated by the steps of: obtaining a substrate including an underlying feature layer that is polished to expose the copper thereof—step (i); covering the underlying feature layer with a seed layer—step (ii); depositing a metal layer over the seed layer—step (iii); applying a layer of photoresist over the metal layer—step (iv); exposing a positive pattern of vias or features including the appropriately dimensioned layer of the contoured stack—step (v), and etching away the metal layer exposed—step (vi). A wet etch, such as a solution of ammonium hydroxide at an elevated temperature, may be used. The photoresist is then stripped away, leaving the vias/features including the layer of the stack upstanding—step (vii), and a dielectric material is laminated over the vias/features including the layer of the stack (viii).

To enable further build up, the dielectric layer may be thinned to expose the metal—step (ix). Then a metal seed layer, such as copper, may be deposited over the thinned surface—step (x).

Steps (i) to (x) may be repeated to lay down further layers. The pattern plating process route of FIG. 5 may be combined with or alternated with the panel plating process route of FIG. 6 with different layers laid down with different processes.

Adjacent layers of the stack may be more or less extensive, providing a stepped stack which may be pyramidal, inverted pyramidal, outwardly or inwardly bowed, with layers having straight or curved edges.

The above description is provided by way of explanation only. It will be appreciated that the present invention is capable of many variations.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components

What is claimed is:

1. A multilayer electronic support structure comprising a plurality of layers extending in an X-Y plane consisting of a dielectric material comprising a polymer, surrounding metal via posts that conduct in a Z direction perpendicular to the X-Y plane, wherein a stacked via structure crossing at least two via layers of the plurality of layers comprises at least two via posts in neighboring via layers wherein the at least two stacked via posts in neighboring layers have different dimensions in the X-Y plane, such that the stacked via structure tapers.

2. The multilayer electronic support structure of claim 1, wherein the stacked via structure comprises at least three via posts.

3. The multilayer electronic support structure of claim 1, wherein the stacked via structure is rectangular and each subsequent layer extends in one direction less than each previous layer and the stacked via structure has a stepped profile in one direction.

4. The multilayer electronic support structure of claim 1, wherein the stacked via structure is rectangular and each subsequent via extends in two opposite directions less than each previous via and the stacked via structure has a generally trapezoidal shape.

5. The multilayer electronic support structure of claim 1, wherein the stacked via structure is rectangular and each subsequent via extends in three opposite directions less than each previous via and the stacked via structure has a generally pyramidal shape with three stepped diagonal side faces and one substantially smooth side face perpendicular to a top and bottom surface of the multilayer composite electronic structure.

6. The multilayer electronic support structure of claim 1, wherein the stacked via structure is rectangular and each subsequent via extends in four opposite directions less than each previous layer and the stack has a generally stepped pyramid shape.

7. The multilayer electronic support structure of claim 1, wherein the stacked via structure is circular and each subsequent via extends less than each previous via and the stacked via structure has a generally stepped conical shape.

8. The multilayer electronic support structure of claim 1, wherein the stacked vias structure comprises at least 4 vias.

9. The multilayer electronic support structure of claim 1, wherein the stacked vias structure comprises at least 5 vias.

10. The multilayer electronic support structure of claim 1, wherein at least one metal layer comprises a metal seed layer.

11. The multilayer electronic support structure of claim 10, wherein the seed layer further comprises an adhesive metal layer first laid down to promote adhesion to the dielectric material.

12. The multilayer electronic support structure of claim 11, wherein the adhesive metal layer comprises at least one of the group comprising titanium, chromium, tantalum and tungsten.

13. The multilayer electronic support structure of claim 1, wherein a bottom layer in the stacked via structure is at least 30% larger than a top layer.

14. The multilayer electronic support structure of claim 1, wherein the stacked via structure crossing at least two layers of the plurality of layers comprises at least two neighboring via posts, wherein the at least two neighboring via posts have different dimensions in the X-Y plane, and a seed layer interposed between the two neighboring via posts extends further in the X-Y plane than at least one of the two neighboring via posts.

15. The multilayer electronic support structure of claim 14, wherein the seed layer extends further in the X-Y plane than the two neighboring via posts.

16. The multilayer electronic support structure of claim 15, wherein the seed layer comprises copper.

17. The multilayer electronic support structure of claim 1 wherein the dielectric material comprises at least one of the group consisting of glass fibers, ceramic particle inclusions and glass particle inclusions.

18. The multilayer electronic support structure of claim 1 wherein previous vias of the stacked via structure extend further in the X-Y plane than subsequent vias and the stacked via structure has a generally pyramidal shape.

19. The multilayer electronic support structure of claim 1 wherein previous vias of the stacked via structure extend less in the X-Y plane than the extent of subsequent vias and the stack has a generally inverse pyramidal shape.

20. The multilayer electronic support structure of claim 1 wherein the stacked via structure comprising more than three via layers, wherein at least one inner via extends further than outer vias and the stacked via structure has an outwardly bowing profile on said at least one side.

21. The multilayer electronic support structure of claim 20 wherein the stacked via structure comprises more than three layers, wherein at least one inner via extends less than neighboring outer vias, and the stack has an inwardly bowing profile on said at least one side.

22. The multilayer electronic support structure of claim 1, wherein the at least one via layer is fabricated by a process comprising the steps of:
(a) obtaining a substrate including an underlying via layer that is treated to expose ends of vias in the underlying via layer;
(b) covering the substrate with a seed layer;
(c) applying a layer of photo-resist over the seed layer;
(d) exposing and developing the photo-resist to form a negative pattern of features;
(e) depositing metal into the negative pattern to fabricate a layer of features;
(f) stripping away the photo-resist, leaving the layer of features upstanding;
(g) applying a second layer of photoresist over the seed layer and the layer of features;
(h) exposing and developing a pattern of vias in the second layer of photoresist;
(i) electroplating copper into the second pattern, and
(j) stripping away the second layer of photoresist:
(k) removing the seed layer, and
(l) laminating a dielectric material over the features and vias that comprise the at least one via layer.

23. The multilayer electronic support structure of claim 22, wherein the process comprises the further step of: (m) thinning the dielectric material to expose ends of the pattern of vias.

24. The multilayer electronic support structure of claim 22, wherein the process comprises the further step: (n) depositing a metal seed layer over the thinned dielectric material with the exposed ends of the pattern of vias.

25. The multilayer electronic support structure of claim 22, further characterized by at least one of:
(i) the seed layer comprises copper;
(ii) the metal layer comprises copper;
(iii) the dielectric material comprises a polymer, and
(iv) the dielectric material comprises ceramic or glass reinforcements.

26. The multilayer electronic support structure of claim 22, further characterized by at least one of:
(i) the dielectric layer comprises a polymer selected from the group comprising polyimide, epoxy, Bismaleimide, Triazine and blends thereof;
(ii) the dielectric layer comprises glass fibers, and
(iv) the dielectric layer comprises particle fillers.

27. The multilayer electronic support structure of claim 1, wherein the at least one via layer is fabricated by a process comprising the steps of:
(i) obtaining a substrate including a feature layer and having exposed copper;
(ii) covering the feature layer with a seed layer;
(iii) depositing a metal layer over the seed layer;
(iv) applying a layer of photo-resist over the metal layer;
(v) exposing a positive pattern of vias in the photoresist;
(vi) etching away the metal layer exposed;
(vii) stripping away the photo-resist, leave the at least one via layer upstanding, and
(viii) laminating a dielectric material over the at least one via layer.

28. The multilayer electronic support structure of claim 27, comprising the further step: (ix) thinning the dielectric material to expose ends of vias in the at least one via layer.

29. The multilayer electronic support structure of claim 27, comprising the further step: (x) depositing a metal seed layer over the ground surface.

* * * * *